(12) United States Patent
Shioga et al.

(10) Patent No.: US 7,940,516 B2
(45) Date of Patent: May 10, 2011

(54) CAPACITOR AND ELECTRONIC SUBSTRATE INCLUDING THE SAME

(75) Inventors: Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/850,209

(22) Filed: Aug. 4, 2010

(65) Prior Publication Data

US 2010/0321911 A1 Dec. 23, 2010

Related U.S. Application Data

(62) Division of application No. 11/857,622, filed on Sep. 19, 2007, now Pat. No. 7,793,396.

(30) Foreign Application Priority Data

Sep. 20, 2006 (JP) ................................. 2006-254424

(51) Int. Cl.
*H01G 9/00* (2006.01)

(52) U.S. Cl. ........ 361/523; 361/516; 361/517; 361/525; 361/528; 361/529; 29/25.01; 29/25.03

(58) Field of Classification Search .................. 361/523, 361/516–519, 525–529, 530–531, 303–305, 361/301.2, 301.4, 311–313, 321.1, 306.2; 29/25.01, 25.03

See application file for complete search history.

(56) References Cited

U.S. PATENT DOCUMENTS

| | | | |
|---|---|---|---|
| 6,466,430 B2 * | 10/2002 | Mido et al. .................... 361/529 |
| 6,498,714 B1 | 12/2002 | Fujisawa et al. | |
| 6,678,144 B2 * | 1/2004 | Higashi et al. ............. 361/306.3 |
| 6,855,177 B2 * | 2/2005 | Fujii et al. .................... 29/25.03 |
| 6,917,514 B2 * | 7/2005 | Mido et al. ..................... 361/533 |
| 6,979,854 B2 | 12/2005 | Yamasaki et al. | |
| 6,986,965 B2 * | 1/2006 | Jenson et al. ................. 429/162 |
| 7,072,168 B2 | 7/2006 | Horikawa et al. | |
| 7,457,103 B2 * | 11/2008 | Yoshida et al. ............... 361/523 |
| 2008/0068780 A1 | 3/2008 | Shioga et al. | |

FOREIGN PATENT DOCUMENTS

| | | |
|---|---|---|
| JP | 2004-214589 A | 7/2004 |
| JP | 2005-12084 A | 1/2005 |
| JP | 2005-150710 A | 6/2005 |
| JP | 2007-96226 A | 4/2007 |

* cited by examiner

*Primary Examiner* — Nguyen T Ha
(74) *Attorney, Agent, or Firm* — Westerman, Hattori, Daniels & Adrian, LLP

(57) ABSTRACT

A capacitor including a substrate; a conductive layer provided on the substrate and containing conductive particles; a valve metal sheet having a dielectric part formed throughout an entire surface of the conductive layer; a protection layer covering the valve metal sheet; a first electrode terminal electrically connected to the conductive layer and partially exposed from an external surface of the protection layer; and a second electrode terminal electrically connected to a surface of the valve metal sheet which is opposite to a surface of the valve metal sheet on which the dielectric part is provided, and the second electrode terminal partially exposed from the external surface of the protection layer; wherein the dielectric part is made of an oxide of a metallic material of the valve metal sheet, the dielectric part is formed with a corrugated surface on the conductive layer, and the conductive particles of the conductive layer are in contact with the corrugated surface of the dielectric part.

9 Claims, 11 Drawing Sheets

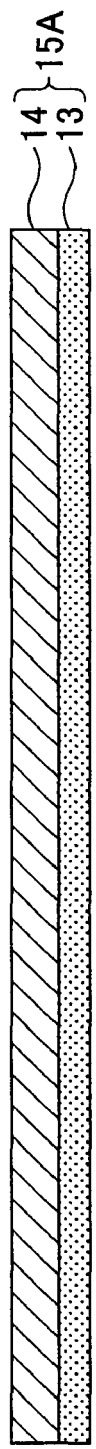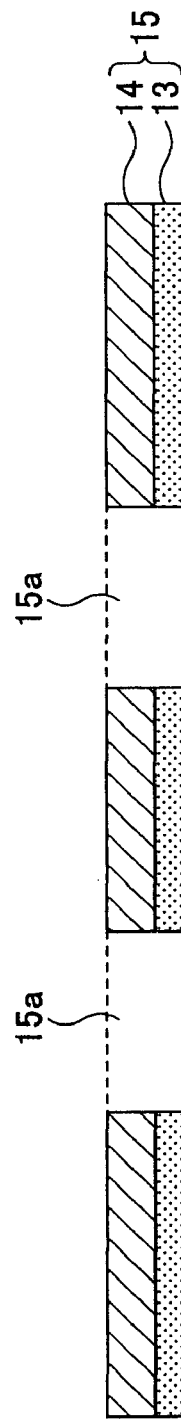

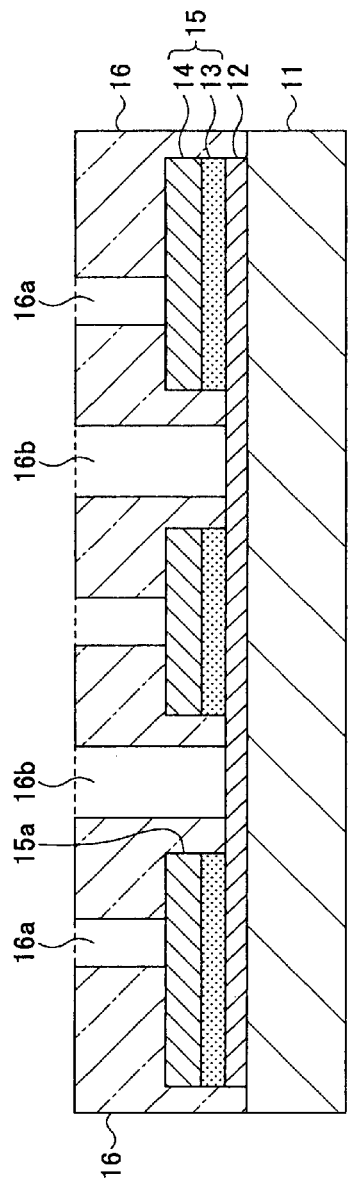
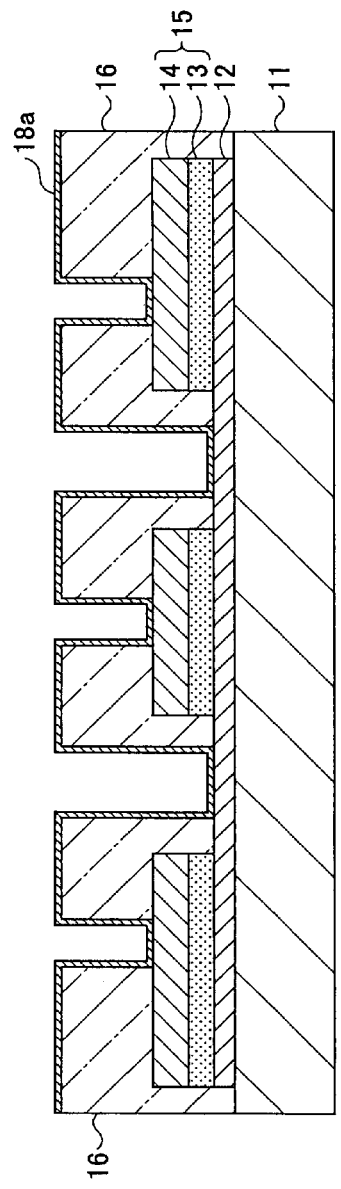

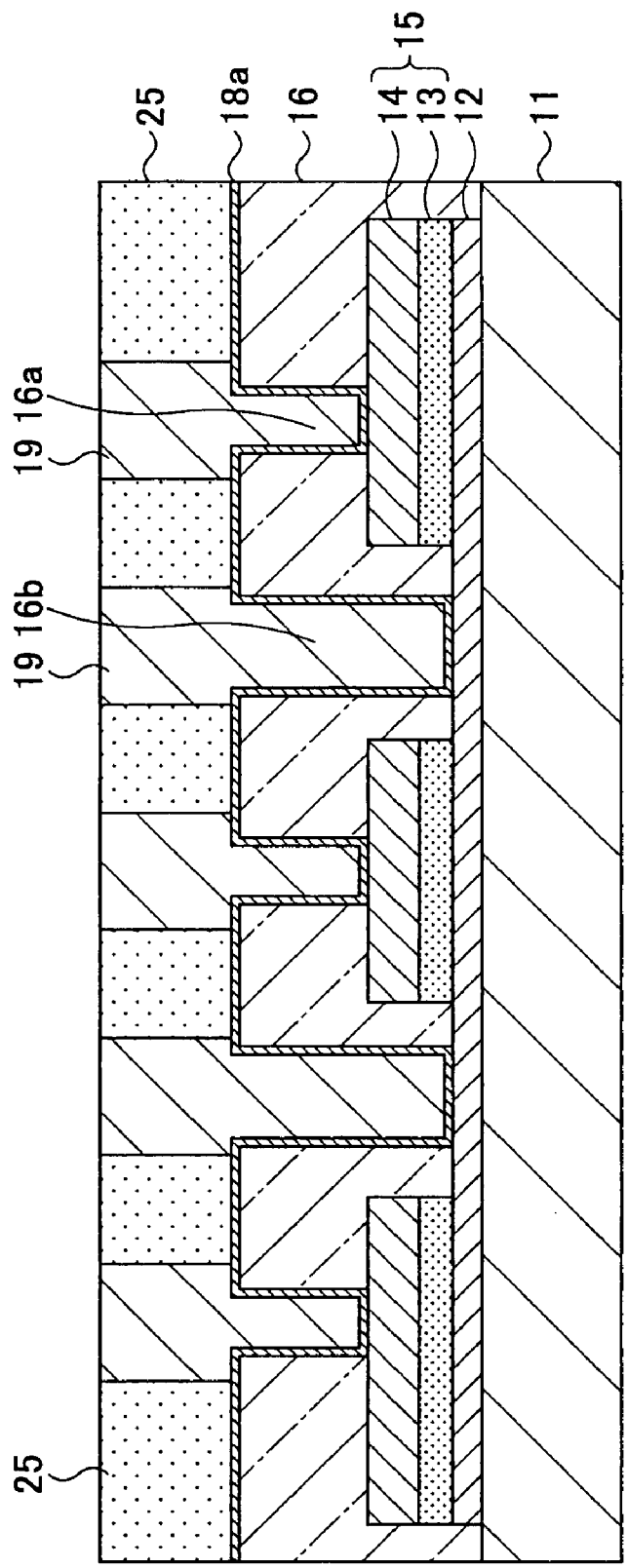

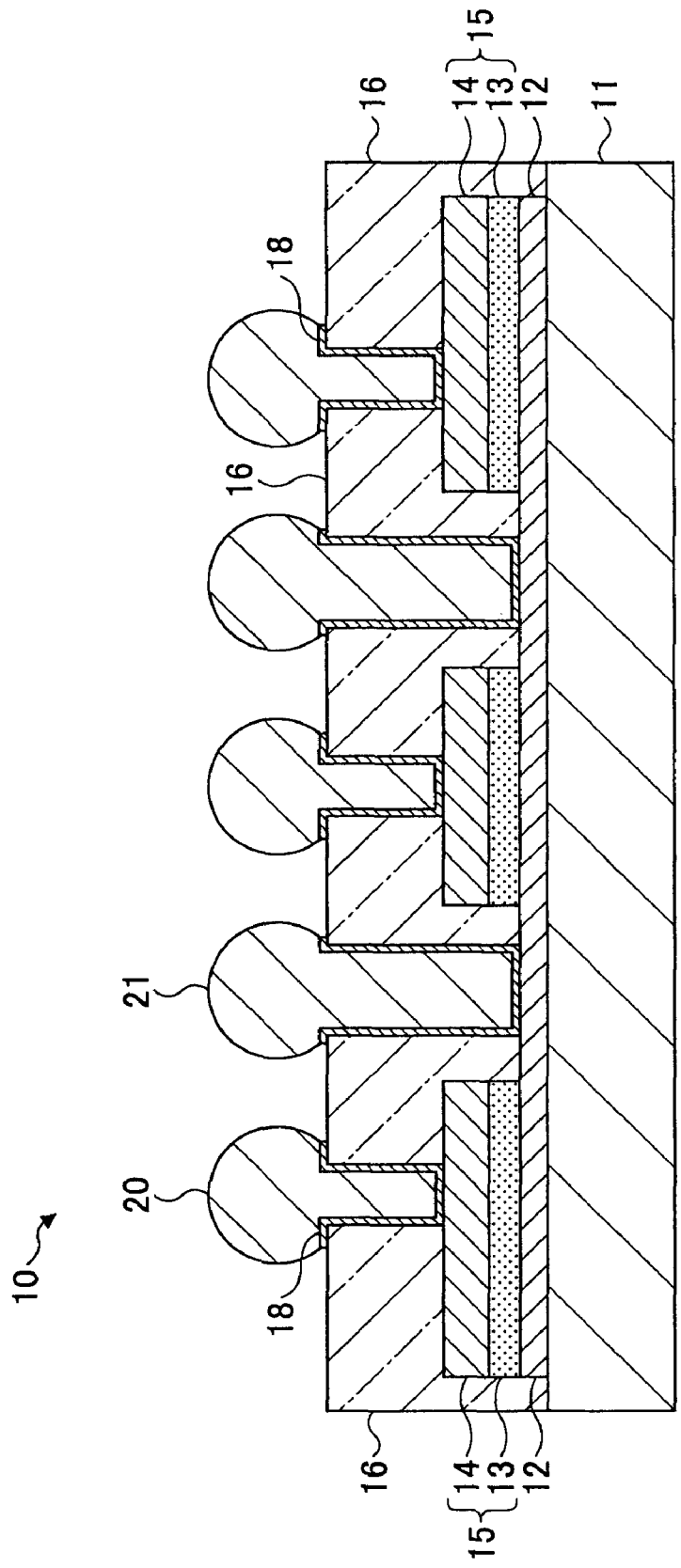

US 7,940,516 B2

CAPACITOR AND ELECTRONIC SUBSTRATE INCLUDING THE SAME

CROSS-REFERENCE TO RELATED APPLICATION

This application is a divisional application of Ser. No. 11/857,622, filed Sep. 19, 2007, which is based upon and claims the benefit of priority of Japanese patent application No. 2006-254424, filed on Sep. 20, 2006, the entire contents of which are herein incorporated by reference.

BACKGROUND OF THE INVENTION

1. Field of the Invention

This invention generally relates to a capacitor, a manufacturing method thereof, and an electronic substrate including the capacitor, and more particularly to a capacitor which is appropriate for a decoupling capacitor, a manufacturing method of the capacitor, and an electronic substrate including the capacitor.

2. Description of the Related Art

In recent years, in semiconductor integrated circuit devices including microprocessors, improvements for increased operating speed and reduced power consumption are advanced. In order to stabilize operation of a semiconductor integrated circuit device in high frequency areas in GHz bands, at low voltage, it is important to control change of the power supply voltage due to a rapid change of the load impedance, and to remove high frequency noises of the power supply.

In a conventional semiconductor package substrate, a decoupling capacitor which is a type of the multi-layered ceramic capacitor (MLCC) is mounted in the vicinity of a semiconductor integrated circuit device, in order to prevent the change of the power-supply voltage and avoid a malfunction of the semiconductor integrated circuit device due to high frequency noises superimposed on a power-supply line and a ground line.

It is desired that, as the characteristics needed for a decoupling capacitor, the decoupling capacitor has both a large amount of capacitance and a reduced inductance in high frequency areas.

FIG. 1 shows the composition of a conventional thin-film capacitor. As shown in FIG. 1, the thin-film capacitor 100 has a thin-film dielectric layer 103, constituting the capacitor, which is proposed for an increased amount of capacitance.

The thin-film capacitor 100 is manufactured through a thin-film fabrication process using a vacuum system. In the thin-film fabrication process, a lower electrode 102, a dielectric layer 103, and an upper electrode 104 are deposited on a supporting substrate 101 which is made of, for example, silicon.

Since performing a micro fabrication using dry etching is possible for the thin-film capacitor 100, it is possible to make small the wiring length between the lower electrode or the upper electrode and the terminal 105, and the distance between the terminals. Thus, this thin-film capacitor 100 can be formed into a capacitor having low inductance structure. For example, see Japanese Laid-Open Patent Application No. 2004-214589.

On the other hand, conventionally, a solid electrolytic capacitor is used as a capacitor which has a large capacitance. In the case of the solid electrolytic capacitor, it is difficult to make small the distance between the terminals and the wiring length due to the structure thereof. It is likely that the equivalent series inductance (ESL) increases. And the solid electrolytic capacitor does not function as a decoupling capacitor which is able to operate fully in high frequency areas. There is proposed a solid electrolytic capacitor which is adapted for reducing the ESL or the ESR. For example, see Japanese Laid-Open Patent Application No. 2005-012084.

However, the thin-film capacitor 100 as disclosed in Japanese Laid-Open Patent Application No. 2004-214589 has to use an expensive vacuum thin-film forming system, such as a sputtering equipment, as the indispensable installation for forming the lower electrode 102, the upper electrode 104, and the dielectric layer 103. For this reason, the manufacturing cost is increased.

Moreover, the lower electrode 102 and the upper electrode 104 are very thin films on the order of several hundreds nanometers, and it is necessary to use noble metals, such as Pt and Au, which are hard to be oxidized. For this reason, the material cost is also increased. In addition, since the thin films are likely to be short circuited due to inclusion of foreign bodies, such as particles, performing a clearing process for surface improvement may be needed for the yield enhancement. Because of the above factors, it is difficult to attain low-cost manufacturing of the thin-film capacitor.

The solid electrolytic capacitor as disclosed in Japanese Laid-Open Patent Application No. 2005-012084 has a complicated structure. For this reason, the manufacturing processes are complicated, and it is difficult to attain low-cost manufacturing of the solid electrolytic capacitor.

SUMMARY OF THE INVENTION

In an embodiment of the invention which solves or reduces one or more of the above-mentioned problems, there is provided a capacitor including: a substrate; a conductive layer provided on the substrate and containing conductive compounds; a valve metal sheet having a dielectric part formed throughout an entire surface of the conductive layer; a protection layer covering the valve metal sheet; a first electrode terminal electrically connected to the conductive layer and partially exposed from an external surface of the protection layer; and a second electrode terminal electrically connected to a surface of the valve metal sheet which is opposite to a surface of the valve metal sheet on which the dielectric part is provided, and the second electrode terminal partially exposed from the external surface of the protection layer; wherein the dielectric part is made of an oxide of a metallic material of the valve metal sheet, the dielectric part is formed with an uneven surface on the conductive layer, and the conductive compounds of the conductive layer are in contact with the uneven surface of the dielectric part.

In an embodiment of the invention which solves or reduces one or more of the above-mentioned problems, there is provided a manufacturing method of a capacitor, the method including the steps of: forming a dielectric part by oxidizing an entire first surface of a valve metal sheet; forming a through hole in the valve metal sheet in which the dielectric part is formed; applying an adhesive conductive material to a surface of a substrate; attaching the valve metal sheet in which the through hole is formed, to the substrate so that the first surface contacts the conductive material on the substrate surface; forming a conductive layer by curing the conductive material; forming a protection layer which covers a second surface of the valve metal sheet which is opposite to the first surface of the valve metal sheet; forming openings in the protection layer, so that the conductive layer in the through hole and the second surface of the valve metal sheet are partially exposed from the openings; and filling up the openings in the protection layer with another conductive material to form electrode terminals.

In an embodiment of the invention which solves or reduces one or more of the above-mentioned problems, there is provided an electronic substrate including a capacitor, a semiconductor device, and a wiring substrate provided to connect the capacitor and the semiconductor device electrically, wherein the capacitor comprises: a substrate; a conductive layer provided on the substrate and containing conductive particles; a valve metal sheet having a dielectric part formed throughout an entire surface of the conductive layer; a protection layer covering the valve metal sheet; a first electrode terminal electrically connected to the conductive layer and partially exposed from an external surface of the protection layer; and a second electrode terminal electrically connected to a surface of the valve metal sheet which is opposite to a surface of the valve metal sheet on which the dielectric part is provided, and the second electrode terminal partially exposed from the external surface of the protection layer; wherein the dielectric part is made of an oxide of a metallic material of the valve metal sheet, the dielectric part is formed with an uneven surface on the conductive layer, and the conductive particles of the conductive layer are in contact with the uneven surface of the dielectric part.

BRIEF DESCRIPTION OF THE DRAWINGS

Other objects, features and advantages of the present invention will become more apparent from the following detailed description when read in conjunction with the accompanying drawings.

FIG. 6A is a diagram showing a manufacturing method of a capacitor in an embodiment of the invention.

FIG. 6B is a diagram showing a manufacturing method of the capacitor in this embodiment.

FIG. 6E is a diagram showing a manufacturing method of the capacitor in this embodiment.

FIG. 6F is a diagram showing a manufacturing method of the capacitor in this embodiment.

FIG. 6G is a diagram showing a manufacturing method of the capacitor in this embodiment.

FIG. 6H is a diagram showing a manufacturing method of the capacitor in this embodiment.

DETAILED DESCRIPTION OF THE PREFERRED EMBODIMENTS

A description will now be given of an embodiment of the invention with reference to the accompanying drawings.

Figure 1:
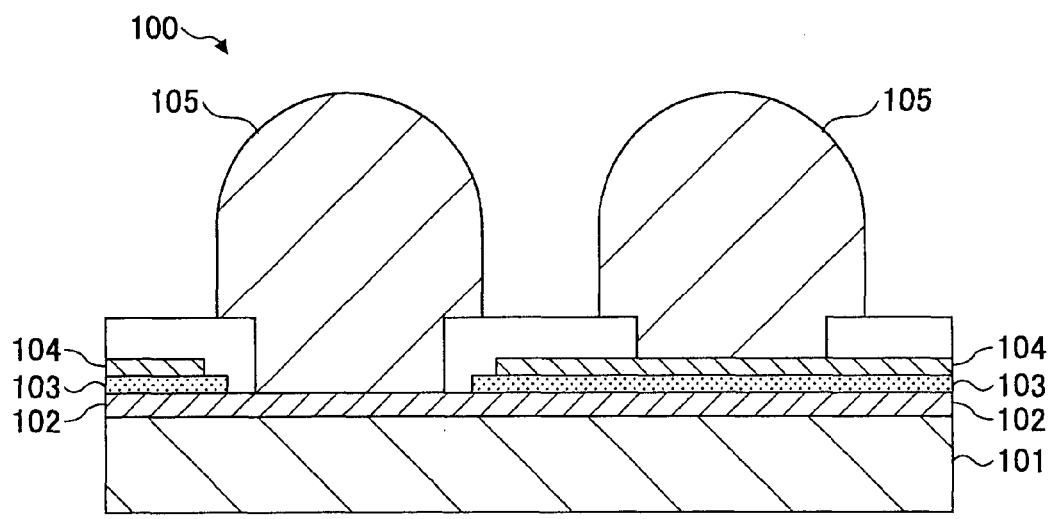
FIG. 1 is a cross-sectional view of a conventional thin-film capacitor.
Figure 2:
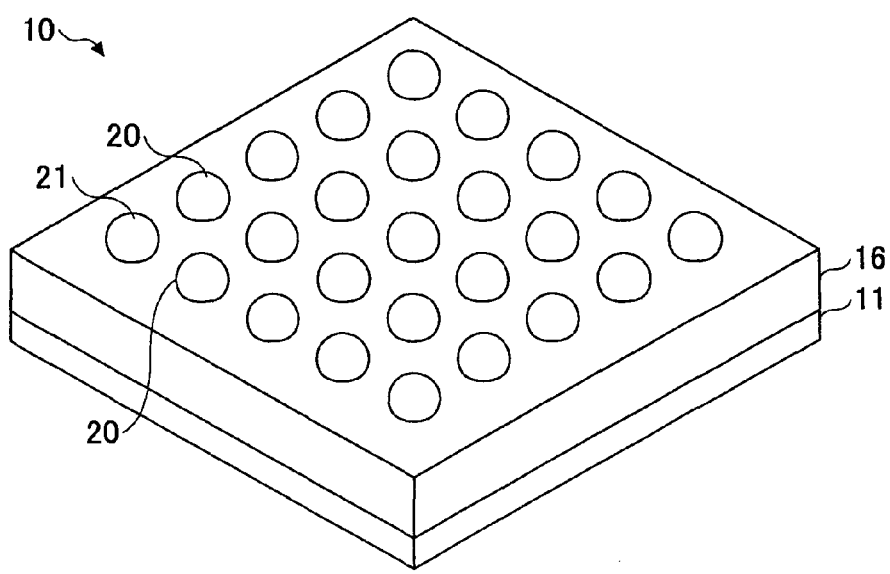
FIG. 2 is a perspective view of a capacitor in an embodiment of the invention.
Figure 3:
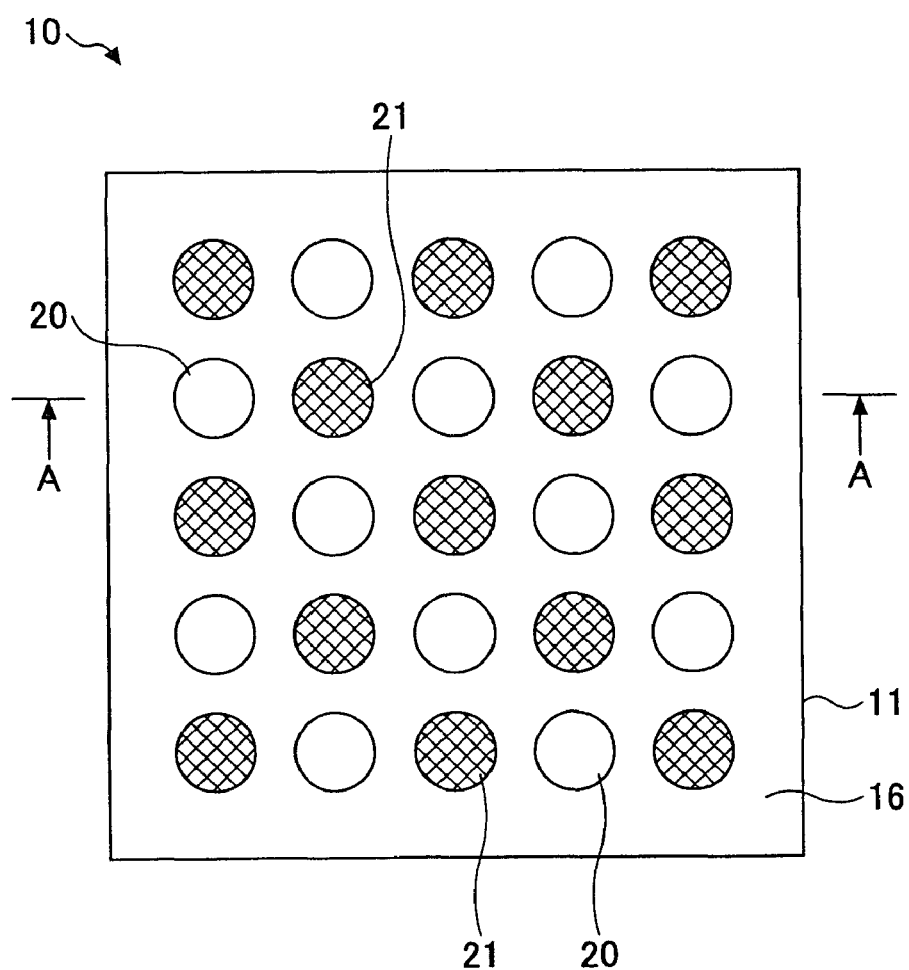
FIG. 3 is a plan view of the capacitor shown in FIG. 2.
Figure 4:
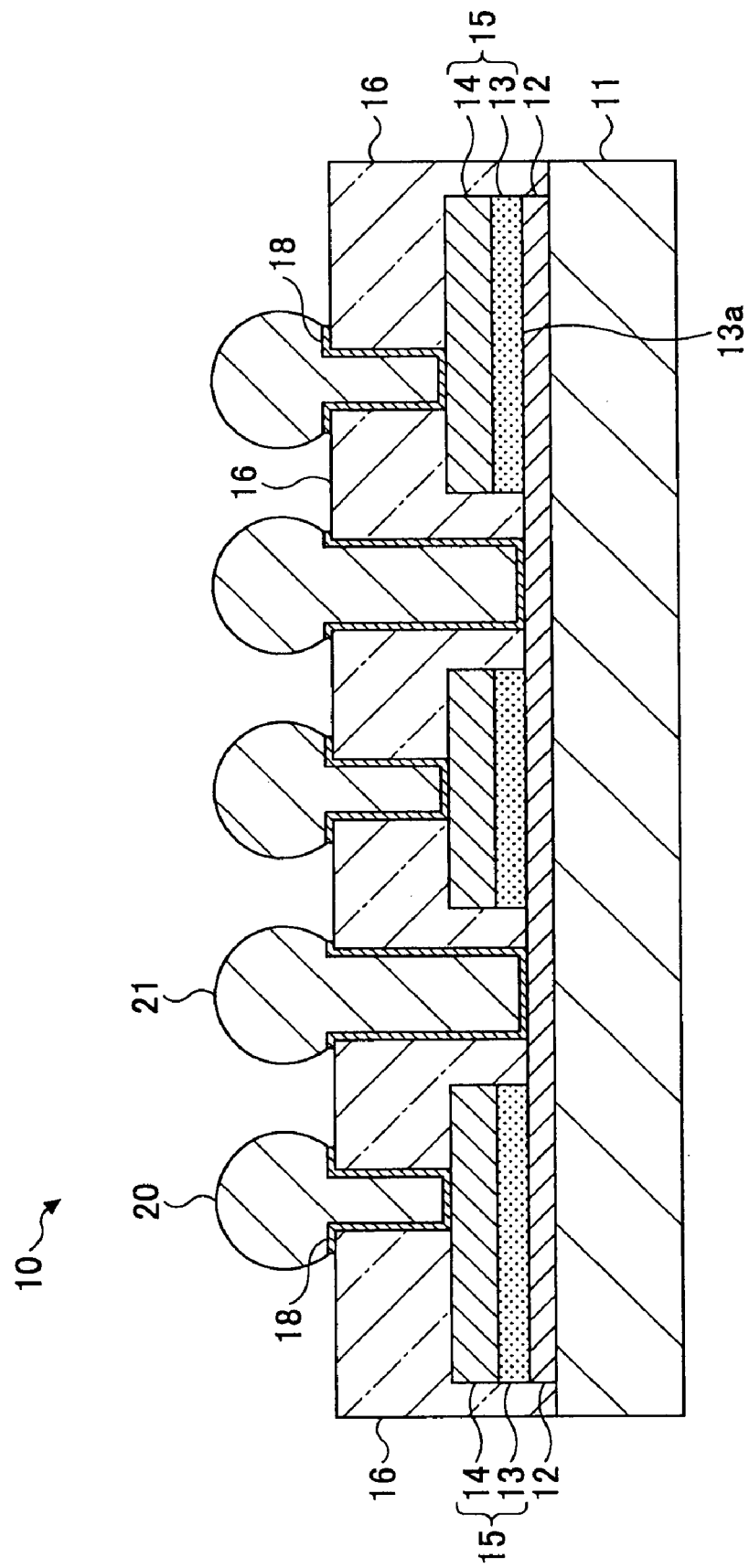
FIG. 4 is a cross-sectional view of the capacitor taken along the line A-A indicated in FIG. 3.

FIG. 2 is a perspective view of a capacitor in an embodiment of the invention. FIG. 3 is a plan view of the capacitor shown in FIG. 2. FIG. 4 is a cross-sectional view of the capacitor taken along the line A-A indicated in FIG. 3.

As shown in FIG. 2 through FIG. 4, the capacitor in this embodiment comprises a substrate 11, a lower electrode 12, a valve metal sheet 15, a protection layer 16, and electrode terminals 20, 21. The lower electrode 12 is formed on the substrate 11. The valve metal sheet 15 includes an oxide-film dielectric layer 13 formed on the lower electrode 12, and an upper electrode 14 formed on the dielectric layer 13. The protection layer 16 is provided so that the valve metal sheet 15 is enclosed in the protection layer 16. The electrode terminal 20 and the electrode terminal 21 are electrically connected to the upper electrode 14 and the lower electrode 12, respectively. The electrode terminals 20 and 21 are formed by penetrating the protection layer 16.

The electrode terminal 21 connected to the lower electrode 12 is formed through the inside of an opening which penetrates the valve metal sheet 15 in a thickness direction of the valve metal sheet 15. The electrode terminals 20 and 21 are formed so that the protection layer 16 is penetrated by the terminals 20 and 21.

As is described below in detail, the capacitor 10 has a simple composition which is constituted by the lower electrode 12, the oxide film dielectric layer 13, and the upper electrode 14, and it is possible to allow yield improvement without the need of expensive manufacturing facilities.

The substrate 11 may be made of an insulating sheet material which is not limited to a particular material. For example, the material of the substrate 11 is chosen from among a glass substrate, a silicon substrate, a glass epoxy group substrate, polyimide resin, etc. For example, if the substrate 11 is made of a glass substrate, the thickness of the substrate 11 may be about 300 micrometers.

The lower electrode 12 is made of a resin material which is about 50 micrometers thick and contains conductive particles. For example, a conductive paste may be used to form the lower electrode 12. In the conductive paste, highly conductive particles, such as Ag, Au, Cu, and graphite, are distributed in a resin material, such as epoxy resin or polyimide resin.

Figure 5:
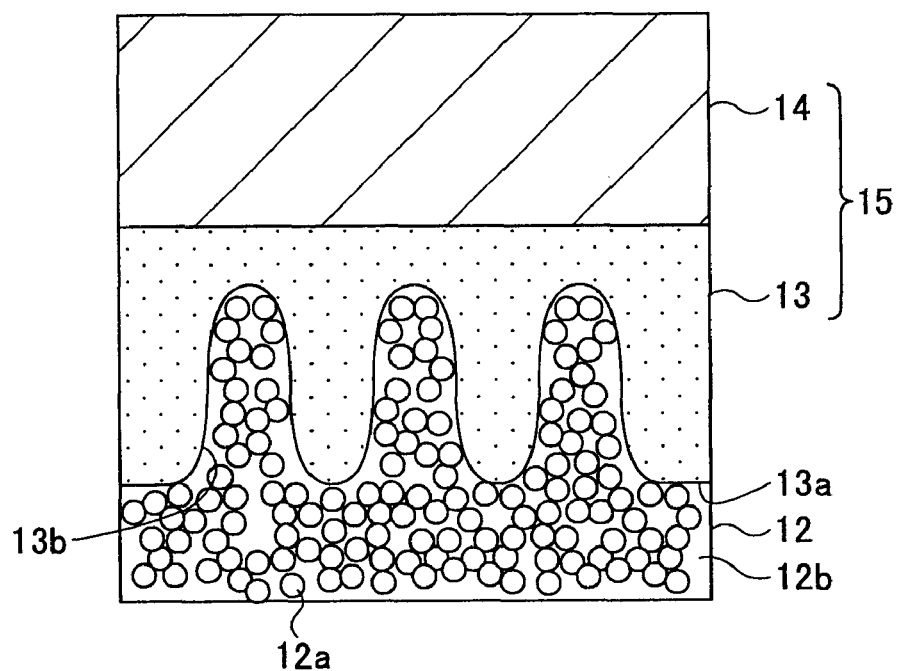
FIG. 5 is an expanded cross-sectional view of the principal part of the capacitor in this embodiment.

FIG. 5 is an expanded cross-sectional view of the principal part of the capacitor in this embodiment. The cross-section of the lamination part of the lower electrode 12, the oxide film dielectric layer 13, and the upper electrode 14 is shown in FIG. 5.

Referring to FIG. 5 as well as FIG. 2 through FIG. 4, the conductive particles 12a contained in the lower electrode 12 are distributed in the resin material 12b. It is preferred that the average grain size of the conductive particles 12a is smaller than the average pore diameter of the pores 13b formed in the surface of the oxide film dielectric layer 13 which is in contact with the lower electrode 12.

By this composition, the pores 13b are filled up with the conductive particles 12a sufficiently, the substantial area in which the lower electrode 12 and the oxide film dielectric layer 13 touch each other increases, and the electrostatic capacitance of the capacitor 10 can be increased.

It is preferred that the average grain size of the conductive particles 12a is set to be in a range of 2 nm-10 nm according to the size of the pores 13b of the oxide film dielectric layer 13 so that the pores 13b can be filled up sufficiently with the conductive particles 12a.

With the pores 13b being filled up with the conductive particles sufficiently, the electrostatic capacitance increases and it is stabilized at a predetermined saturation value according to the surface density and size of the pores of the oxide film dielectric layer 13. Thus, the setting of the electrostatic capacitance of the capacitor can be easily carried out.

It is preferred that the resistibility of the lower electrode 12 after the curing of the conductive paste is 10 μΩcm or less, in order to avoid increasing of the resistance of the capacitor too much. Although it is preferred that the resistibility of the lower electrode 12 is as small as possible, the lower limit of the resistibility of the lower electrode 12 is 0.1 μΩcm, which is equal to the resistibility of Au.

The oxide film dielectric layer 13 is formed in the surface by the side of the lower electrode 12.

On the surface of the opposite side, the valve metal material is exposed, and it is functioning as the surface on which oxide film dielectric layer 13 is formed as upper electrode 14.

That is, the oxide film dielectric layer 13 and upper electrode 14 are unified.

The valve metal sheet 15 will be explained later with respect to the manufacturing method of the capacitor. The valve metal sheet 15 is produced as follows. An oxide layer is formed on one surface of a foil or sheet of the valve metal material by using an anodic oxidation method, and this oxidation portion is formed into the oxide film dielectric layer 13. And the remaining metal portion of the valve metal material which remains non-oxidized is formed into the upper electrode 14. Therefore, the oxide film dielectric layer 13 and the upper electrode 14 are unified, and the respective portions are closely in contact with each other, thereby avoiding physical exfoliation.

As the valve metal material applicable to the valve metal sheet 15, aluminium, tantalum, niobium, titanium, hafnium, zirconium, zinc, tungsten, bismuth, antimony, etc. may be mentioned. Among them, more suitable materials for the valve metal sheet 15 are aluminium, tantalum, and niobium because they are easily procured. As for the valve metal material, by using the anodic oxidation method, an anodic oxide film of the valve metal material can be formed easily, and this oxide film constitutes the oxide film dielectric layer 13.

The oxide film dielectric layer 13 is made of an anodic oxidization of the valve metal material, and it is an dielectric material. In the oxide film dielectric layer 13, unevenness (uneven surface 13a) is formed on its surface which is in contact with the lower electrode 12. This unevenness is formed when the surface of the valve metal sheet 15 is oxidized.

Since the conductive particles of the lower electrode 12 contact the uneven surface 13a, the oxide film dielectric layer 13 and the lower electrode 12 are in close contact with each other, and the total contact area increases. As a result, the capacitance increases.

The corrugated surface 13a of the oxide film dielectric layer 13 may be formed as a porous layer. For example, it is desirable that the corrugated surface 13a is formed as a porous layer in which the pores the average pore diameter of which is in a range of 100 nm-500 nm are distributed.

As will be explained later, the corrugated surface 13a can be formed by an electrolytic etching process. In this case, the contact area between the oxide film dielectric layer 13 and the lower electrode 12 increases with the pores being filled up with the conductive paste of the lower electrode 12.

The upper electrode 14 is 50 micrometers thick, for example. The upper electrode 14 is constituted by the metal part of the valve metal sheet 15. The metal part is made of any of the valve metal materials mentioned above.

As a suitable protection layer, benzocyclobutene resin, polyimide resin, epoxy resin, bismaleimide resin, maleimide resin, cyanide resin, polyphenylene ether resin, polyphenylene oxide resin, fluorine containing resin, liquid crystal polymer, polyetherimide resin, and polyetheretherketone resin are mentioned. It is preferred that the protection layer is made of a photosensitive resin. If a photosensitive resin is selected, formation of an excessive photoresist layer and the etching process which are needed to form openings in the protection layer in the case of another resin can be omitted.

The electrode terminal 20 and the electrode terminal 21 are made of an conductive material, such as Sn—Ag solder. They contact the surface of the upper electrode 14 and the surface of the lower electrode 12, respectively, and they are electrically connected together.

The electrode terminal 20 and the electrode terminal 21 are formed with the plating seed layer 18 (which will be described later), and the plating seed layer 18 is provided on the surface of each of the openings of the lower electrode 12, the upper electrode 14, and the protection layer 16 which are filled up with the electrode terminal material.

The electrode terminal 21 connected to the lower electrode 12 is electrically insulated by the protection layer, in order to avoid contact with the oxide film dielectric layer 13 and the opening of the upper electrode 14.

As shown in FIG. 3, the electrode terminals 20 and 21 are arranged in a lattice formation. The electrode terminals 21 connected to the lower electrode 12 and the electrode terminals 20 connected to the upper electrode 14 are alternately arranged in each of two orthogonal directions (or X-axis and Y-axis directions) of the capacitor 10.

The above arrangement of the electrode terminals allows the mutual inductance which is generated between electrode terminal 20 and 21 according to the electric current flowing through the electrode terminals 20 and 21, to be canceled by each other. Therefore, the impedance of the capacitor in high frequency ranges, especially in high frequency ranges of 1 GHz or more, can be reduced.

Of course, the arrangement of the electrode terminals may be modified such that the electrode terminals 20 connected to the lower electrodes 12 are arrayed in a row (in the X-axis direction), and the electrode terminal 21 connected to the upper electrodes 14 are arrayed in a row (in the X-axis direction), and these rows are alternately arranged in columns in the direction of the Y-axis. Of course, this arrangement may be changed to the arrangement in which the direction of the X-axis and the direction of the Y-axis are reversed.

As explained above, the capacitor 10 in this embodiment is provided so that the valve metal sheet 15 has the oxide film dielectric part 31 which is made of the oxide of the valve metal material and covers the entire surface of one of the upper and lower surfaces of the valve metal sheet 15, and has the upper electrode 14 which is provided on the other surface of the upper and lower surfaces of the valve metal sheet 15.

The conductive particles of the lower electrode 12 contact the uneven surface 13a of the surface of the oxide film dielectric layer 13 sufficiently. As a result, the use of expensive materials, such as noble metals, is unnecessary and the complicated structure is also unnecessary. Therefore, the cost of the capacitor 10 can be reduced.

Next, a manufacturing method of a capacitor in an embodiment of the invention will be explained with reference to FIG. 6A through FIG. 6H.

FIG. 6A through FIG. 6H are diagrams for explaining the manufacturing method of the capacitor in this embodiment.

First, at the step of FIG. 6A, a valve metal sheet (for example, an aluminum foil or an aluminum sheet) is prepared, and one surface of the valve metal sheet is oxidized to form an oxide film dielectric layer 13 (oxide film dielectric part formation process). As the oxidation method of the valve metal sheet, an anodic oxidation method and an oxygen plasma etching process are mentioned.

For example, in the case of the anodic oxidation method, a valve metal sheet (for example, an aluminum foil) is immersed in any of a sulfuric acid bath, a phosphoric acid bath, an oxalic acid bath and an adipic acid ammonium bath, one surface of the aluminum foil is used as an anode, and a carbon or platinum electrode is used as a cathode. And the cathode is immersed in the bath, and a given voltage is applied between the anode and the cathode. When the anodic oxidation method is used, one surface of the aluminum foil is changed into an amorphous alumina and it forms the oxide film dielectric layer 13. On the opposite surface of the aluminum foil which is opposite to the surface in which the oxide film dielectric layer 13 is formed.

When the oxygen plasma etching process is used, one surface of the valve metal sheet 15A is exposed to the oxygen ions which are electrically dissociated through generation of the plasma in the oxygen environment, so that the oxide film dielectric layer 13 is formed.

A surface roughing process may be performed prior to the oxide film dielectric part formation process of FIG. 6A, so that the surface which will be formed as the oxide film dielectric layer 13 of the valve metal sheet 15A is roughened (the surface roughing process). As the surface roughing process, an electrolytic etching process or an chemical etching process may be used. The electrolytic etching process is preferred in that it can form the treating surface into a porous layer, and its surface area can be increased.

In the electrolytic etching process, the well-known processing conditions may be used. For example, a mixed solution of 8% by weight hydrochloric acid and 1% by weight sulfuric acid is used as the electrolytic etching liquid, the etching temperature is 50 degrees C., and the applied voltage is set as the sine wave alternating current voltage so that the frequency is 20 Hz, the current density 180 mA/cm$^2$, and the electrolysis time is 270 seconds.

When the electrolytic etching process is used, a protection layer, such as a resist layer, is formed beforehand on the surface of the valve metal sheet which is not roughened, and the protection layer is removed from the valve metal sheet surface after the surface roughing process.

Subsequently, at the step of FIG. 6B, the through holes, which will penetrate the lower electrode at a subsequent process, are formed in the valve metal sheet (through hole formation process).

The formation of the through holes is not limited to a specific process. It is sufficient that the formation process is to form the through holes about 100 micrometers in diameter in the valve metal sheet. For example, a punching process or a laser-beam-machining method may be used as the through hole formation process.

The sequence of the step of FIG. 6A and the step of FIG. 6B can be reversed. That is, the steps may be performed in order of the through hole formation process and the oxide film dielectric part formation process. Alternatively, the steps may be performed in order of the oxide film dielectric part formation process and the through hole formation process.

Figure 6C:
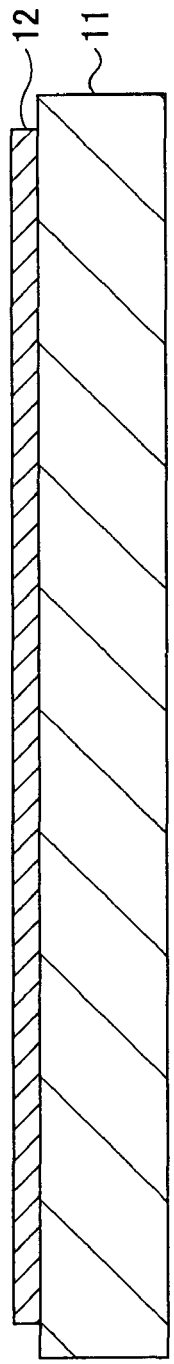
FIG. 6C is a diagram showing a manufacturing method of the capacitor in this embodiment.

On the other hand, at the step of FIG. 6C, an adhesive conductive material is applied to the substrate. For example, a conductive paste is used as the adhesive conductive material. As mentioned above, in the conductive paste, the highly conductive particles, such as Ag, Au, Cu, or graphite, are distributed in the resin, such as epoxy resin or polyimide resin.

It is preferred that the average grain size of the conductive particles contained in the conductive paste is set to be in a range of 2 nm-10 nm according to the size of the pores 13b of the oxide film dielectric layer 13 so that the pores 13b can be filled up sufficiently with the conductive particles.

It is preferred that the content of the conductive particles contained in the conductive paste is set to be in a range of 50% by weight-80% by weight, so that good electric conductivity is attained. It is preferred that the conductive paste has the viscosity at 25 degrees C. in a range of 40 Pa-s-120 Pa-s, so that good spreading characteristic is attained.

Subsequently, at the step of FIG. 6D, the valve metal sheet 15 prepared at the step of FIG. 6B and the substrate 11 to which the conductive paste 12a is applied at the step of FIG. 6C are attached together. At this time, the attaching is performed so that the conductive paste 12a and the oxide film dielectric layer 13 of the valve metal sheet 15 are in contact with each other.

Before the valve metal sheet 15 and the substrate 11 to which the conductive paste 12a is applied are attached together, a conductive polymer may be applied so that the surface of the oxide film dielectric layer 13 may be covered by the conductive polymer. By this conductive polymer, the unevenness of the surface of the oxide film dielectric layer 13 is filled up with the conductive polymer, and a smooth surface is formed. Thereby, the adhesion of the valve metal sheet 15 and the oxide film dielectric layer 13 can be increased.

Simultaneously, the conductive polymer enters more easily than the conductive paste 12a, into the inside of the concave portions of the surface of the oxide film dielectric layer 13, the contact area of the oxide film dielectric layer 13 and the lower electrode is increased, so that the capacitance can be increased.

Applying of the conductive polymer is effective especially when the above-mentioned surface roughing process is performed.

Figure 6D:
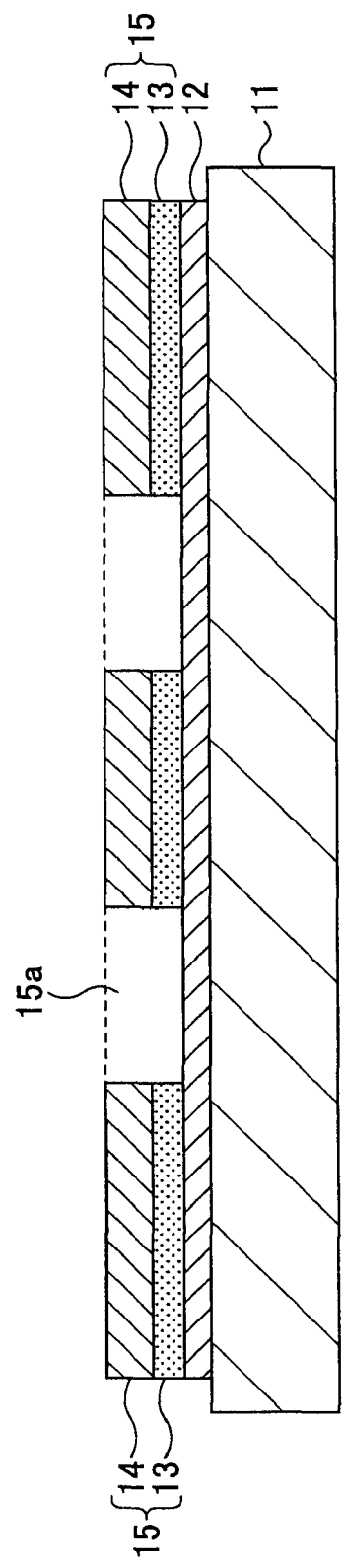
FIG. 6D is a diagram showing a manufacturing method of the capacitor in this embodiment.

Moreover, at the process of FIG. 6D, the conductive paste 12a is cured so that the lower electrode 12 is formed. Thereby, the lower electrode 12, the oxide film dielectric layer 13, and the upper electrode 14 are formed.

Subsequently, at the step of FIG. 6E, a protection layer 16 which is made of a resin material is formed on the surface of the structure of FIG. 6D. It is preferred that the formation of the protection layer is performed by using a photosensitive resin solution (for example, photosensitive polyimide resin or photosensitive epoxy resin), so that it facilitates formation of openings at the following process, and formation of an excessive resist layer and the etching process can be omitted.

Moreover, at the step of FIG. 6E, the openings 16a and 16b are formed at the predetermined positions on the surface of the protection layer 16. The openings 16a and 16b are arranged in a lattice formation so that the surfaces of the lower electrode 12 and the upper electrode 14 may be partially exposed, and the electrode terminals may be arranged as shown in FIG. 3.

In this process, when the oxide film (for example, the oxide film formed in the case of the anodizing) is formed on the surface of the upper electrode 14 (or the surface of the valve metal sheet 15), a dry etching process may be performed to remove the oxide film layer.

Subsequently, at the step of FIG. 6F, a metal-plating seed layer 18a is formed on the surface of the protection layer of FIG. 6E and the inside surfaces of the openings (the inside walls and the lower electrode and upper electrode surfaces). Specifically, the metal-plating seed layer 18a is made of a Ti film, a Cu film, and a nickel film which are formed sequentially by a sputtering process, a vacuum deposition process or a non-electrolytic plating.

Subsequently, at the step of FIG. 6G, a resist layer 25 is formed which covers the surface of FIG. 6F, and the pattern which has the openings 16a and 16b at the locations where the electrode terminals will be formed at the following process, in the resist layer 25. Moreover, at the step of FIG. 6G, the openings 16a and 16b are filled up with the conductive material (for example, Sn—Ag solder) by performing the electroplating process using the metal-plating seed layer 18a as the electric supply layer.

Subsequently, at the step of FIG. 6H, the resist layer 25 shown in FIG. 6F is removed, and the solder balls 20 and 21 are formed by performing a reflow process as shown in FIG. 6H. Moreover, an excessive metal-plating seed layer is removed by the dry etching process. The capacitor is thus formed.

According to the manufacturing method of the capacitor in this embodiment, the vacuum process is not used when forming the lower electrode 12, the oxide film dielectric layer 13, and the upper electrode 14. The manufacture cost can be reduced in contrast to that of the conventional thin-film capacitor mentioned above. Moreover, a reduction of the yield by contamination, such as particles, can be also avoided, and the manufacturing cost of the capacitor can be reduced.

Next, some examples of the capacitor in the present embodiment will be explained.

Figure 7:
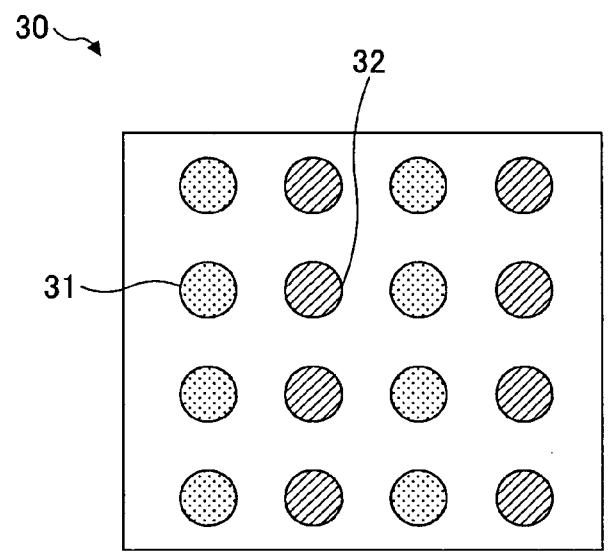
FIG. 7 is a plan view of the capacitor in the case of example 1.
Figure 8:
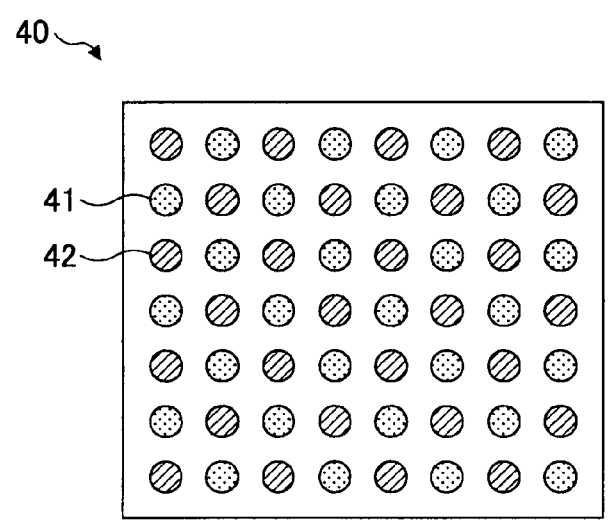
FIG. 8 is a plan view of the capacitor in the case of example 2.

FIG. 7 and FIG. 8 are plan views of the capacitors in the cases of examples 1 and 2 respectively, when viewed from the electrode terminal side.

As shown in FIG. 7, the capacitor 30 in the case of example 1 has the composition that is the same as that of the capacitor in the above embodiment. The capacitor 30 is in the shape of a 1.8 mm by 1.6 mm rectangle, and the electrode terminals 31 and 32 are arranged in a lattice formation in four rows and four columns.

In the capacitor 30 in the case of example 1, the electrode terminals 31 connected to the upper electrodes and the electrode terminals 32 connected to the lower electrodes are arranged alternately each other. The gap in the lengthwise direction and the transverse direction between the electrode terminals is set to 400 micrometers, and the diameter of each electrode terminal is set to 180 micrometers.

As shown in FIG. 8, the capacitor 40 in the case of example 2 has the composition that is the same as that of the capacitor in the above embodiment. The capacitor 40 is in the shape of a 1.8 mm by 1.6 mm rectangle, and the electrode terminals 41 and 42 are arranged in a lattice formation in seven rows and eight columns.

In the capacitor 40 in the case of example 2, the electrode terminal 41 connected to the upper electrodes and the electrode terminal 42 connected to the lower electrodes are arranged alternately both in the lengthwise direction and the transverse direction. The gap in the lengthwise direction and the transverse direction between the electrode terminals is set to 200 micrometers, and an the diameter of each electrode terminal is set to 100 micrometers.

Figure 9:
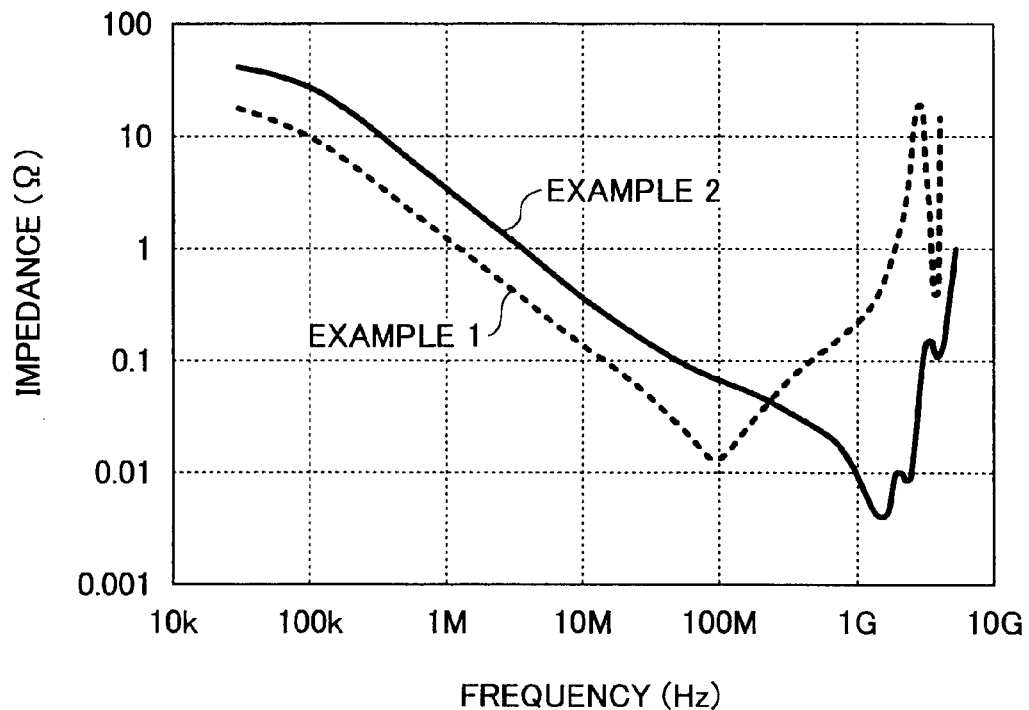
FIG. 9 is a diagram showing the impedance characteristics of the capacitors in the cases of examples 1 and 2.

FIG. 9 is a diagram showing the impedance characteristics of the capacitors in the cases of examples 1 and 2. In FIG. 9, the vertical axis denotes the impedance, the horizontal axis denotes the frequency, and the values of both are in logarithmic scale.

As shown in FIG. 9, it is found out that the impedance in the case of example 2 is lower at high frequencies than that in the case of example 1, and both the equivalent series resistance and the equivalent series inductance in the case of example 2 are lower than those in the case of example 1. The equivalent series inductance in the case of example 1 is 34 pH, and the equivalent series inductance in the case of example 2 is 0.3 pH. This is because the reduced electrode terminals in the case of example 2 are arranged more densely than in the case of example 1, and the arrangement of the electrode terminal 41 connected to the upper electrodes and the electrode terminals 42 connected to the lower electrodes are alternate in both the lengthwise direction and the transverse direction.

According to another consideration of the inventors, it is turned out that, when the arrangement of the electrode terminals connected to the upper electrodes and the electrode terminals connected to the lower electrodes in the case of example 1 is made with the same electrode terminal diameter and the same spacing interval as in the case of example 2, the frequency at which the impedance is at the minimum in the case of example 1 is about 1/10 times that in the case of example 2. Namely, it is found out that, by using the alternate arrangement of the electrode terminals 41 connected to the upper electrodes and the electrode terminals 42 connected to the lower electrodes in the case of example 2 both in the lengthwise direction and the transverse direction, it is possible to make the inductance at high frequencies reduced more effectively.

Next, a capacitor in the case of example 3 according to the above embodiment is produced as follows. First, a perforating process is performed to a 0.2-mm thick aluminum foil by using the laser beam machining process, so that the through holes (120 micrometers in the diameter) are formed. The arrangement of the through holes is essentially the same as the arrangement of the electrode terminals 21 connected to the lower electrodes shown in FIG. 3.

After the aluminum foil in which the through holes are formed is washed with nitrate fluoride and distilled water, the anodizing process is performed in the solution in which 150 g of adipic acid ammonium is dissolved to 1 liter of pure water, and the aluminum oxide film is formed on one surface of the aluminum foil. The temperature of the solution of the anodizing is set to 85 degrees C., the formation voltage is set to 100V, the electric current is set to 0.3 A, and the voltage application time is set to 20 minutes.

Subsequently, the silver nano paste is applied in the thickness of 10 micrometers to the surface of a glass substrate, and the aluminum foil on which the aluminum oxide film is formed is attached to the glass substrate so that the surface of the aluminum oxide film is adhered to the surface where the silver nano paste is applied, and they are bonded together.

Subsequently, the glass substrate to which the aluminum foil is bonded is subjected to the heating process for 1 hour at 200 degrees C. in the atmosphere, so that the silver nano paste is cured.

Subsequently, the photosensitive epoxy resin is applied to the surface of the aluminum foil, so that the photosensitive epoxy resin layer is formed. Specifically, an epoxy varnish is applied through the spin coat process with the rotation speed is set to 2000 rpm and the applying time is set to 30 seconds, so that the photosensitive epoxy resin layer with the thickness of 10 micrometers is formed.

After the pre-baking (the heating temperature: 60 degrees C.) of the photosensitive epoxy resin layer is performed, the openings for making the surfaces of the upper electrode and the lower electrode be exposed are arranged in a lattice formation through the exposure and development process. The arrangement of the openings is essentially the same as the arrangement of the previously described electrode terminals as shown in FIG. 3.

Moreover, the final baking process (the heating temperature: 200 degrees C.) is performed, the epoxy resin layer is cured, and, finally the protection layer of the epoxy resin layer with the thickness of 5 micrometers is formed.

Subsequently, a Ti film (300 nm thick) and a Cu film (200 nm thick) are formed on the openings and the surfaces of the epoxy resin layer through the sputtering process, and a nickel metal-plating film (5 micrometers thick) is formed thereon through the non-electrolytic plating process. Thereby, the under bump metal (UBM) layer which is made of the Ti film, the Cu film and the nickel metal-plating film is formed.

Subsequently, the resist layer which has the openings in which the openings of the above-mentioned protection layer are exposed is formed, a Sn—Ag solder metal-plating film is formed through the electroplating process, the resist layer is removed, and the solder bumps of the Sn—Ag solder metal plating are formed on the surface of the UBM layer through the reflow process. Moreover, the unnecessary UBM layer is removed through the dry etching process.

In the above-mentioned manner, the capacitor in the case of example 3 is formed. The capacitors are produced in the above-mentioned conditions using aluminum foils having various characteristics, and it is found out that the capacitor having the capacitance density in a range of 0.2 microF/cm$^2$-4 microF/cm$^2$ and the withstanding voltage in a range of 20V-100V is obtained.

Next, a capacitor in the case of example 4 according to the above embodiment is produced as follows. First, using the aluminum foil which is the same as that in the case of example 3, a resist layer is formed on the surface of the aluminum foil on which the aluminum oxide film is not formed.

The porous structure is formed on the surface of the aluminum foil on which the resist layer is not formed, through the electrolytic etching process.

The mixed solution of 8% by weight hydrochloric acid and 1% by weight sulfuric acid is used as the electrolytic etching liquid, the etching temperature is set to 50 degrees C., and the applied voltage is set to the sine wave alternating current. The frequency is set to 20 Hz, the current density is set to 180 mA/cm$^2$, and the electrolysis time is set to 270 seconds.

Subsequently, after the resist is removed from the aluminum foil, the anodizing process is performed using the conditions which are the same as those in the case of example 1, and the aluminum oxide film is formed on the surface of the porous structure layer.

Subsequently, the solution containing polyethylene dioxythiophene and styrene sulfonic acid is applied to the surface of the aluminum oxide film, and the surface is dried. The process of the solution applying and surface drying is repeated 5 times.

The subsequent processes which are the same as those in the case of example 3 are performed, and the capacitor in the case of example 4 is produced. The capacitors are produced in the above-mentioned conditions using the aluminum foils having various characteristics which are the same as those in the case of example 1, and it is found out that the capacitor having the capacitance density in a range of 10 microF/cm$^2$-50 microF/cm$^2$ and the withstanding voltage in a range of 3V-50V is obtained.

Next, a capacitor in the case of example 5 according to the above embodiment is produced as follows. First, a perforating process is performed to a 0.15-mm thick niobium foil by using the punching process, so that the through holes (150 micrometers in diameter) are formed. The arrangement of the through holes is essentially the same as the arrangement of the electrode terminals 21 connected to the lower electrodes shown in FIG. 3.

After the niobium foil in which the through holes are formed is washed with nitrate fluoride and distilled water, the anodizing process is performed in the phosphoric acid solution, and the niobium oxide film is formed in one surface of the niobium foil. The temperature of the solution of the anodizing is set to 90 degrees C., the formation voltage is set to 150V, the electric current is set to 0.6 A, and the voltage application time is set to 10 minutes.

The subsequent processes which are the same as those in the case of example 3 are performed, and the capacitor in the case of example 5 is produced.

The capacitors are produced in the above-mentioned conditions using niobium foils having various characteristics, and it is found out that the capacitor having the capacitance density in a range of 1 microF/cm$^2$-25 microF/cm$^2$ and the withstanding voltage in a range of 3V-50V is obtained. The dielectric constant of the niobium oxide film is about 42, and it is larger than the dielectric constant (which is about 8) of the aluminium oxide film. Thus, the capacitance of the capacitor in the case of example 5 can be remarkably increased from that of the capacitor in the case of example 3.

Figure 10:
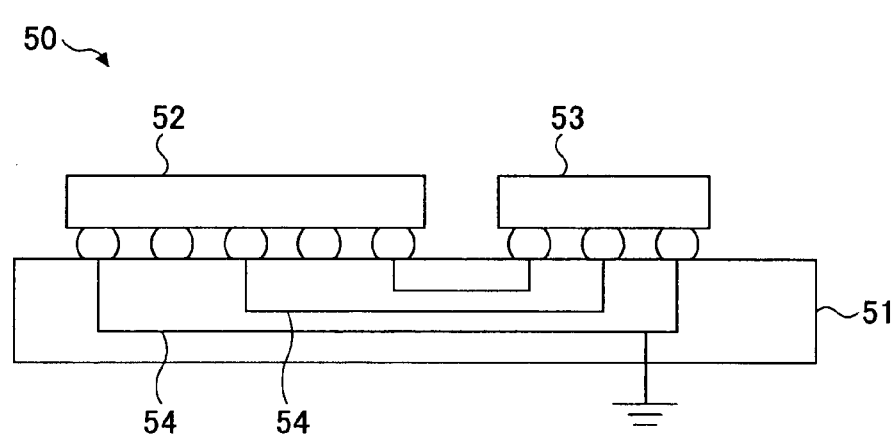
FIG. 10 is a cross-sectional view of an electronic substrate in an embodiment of the invention.

FIG. 10 is a cross-sectional view of an electronic substrate including a capacitor in an embodiment of the invention.

As shown in FIG. 10, the electronic substrate 50 comprises a wiring substrate 51, and an LSI chip 52 and a decoupling capacitor 53 which are mounted on the wiring substrate 51.

The wiring substrate 51 has a wiring layer 54 on the surface of the substrate or within the surface of the substrate. Although the composition of the wiring substrate 51 is not limited to the specifically disclosed embodiment, the wiring substrate 51 is constituted by, for example, a multilayer interconnection substrate.

For example, a semiconductor integrated circuit is formed on the LSI chip 52. The LSI chip 52 is constituted by, for example, an application-specific integrated circuit (ASIC) or a read-only memory (ROM), etc. The decoupling capacitor 53 has the composition which is essentially the same as that of the capacitor in the previously described embodiment.

In the electronic substrate 50, the decoupling capacitor 53 is electrically connected to the LSI chip 52 through the wiring layer, and the decoupling capacitor 53 is electrically inserted between the power-supply line and the ground line.

Since the cost of the decoupling capacitor 53 according to the invention is reduced, the cost of the electronic substrate 50 can also be reduced. Although it is not illustrated, many decoupling capacitors 53 are needed for the LSI chip 52, and the low-cost manufacturing of the decoupling capacitors 53 will contribute to the low-cost manufacturing of the electronic substrate 50 considerably.

The present invention is not limited to the specifically disclosed embodiment, and variations and modifications may be made without departing from the scope of the present invention.

What is claimed is:

1. A capacitor comprising:
   a substrate;
   a conductive layer provided on the substrate and containing conductive particles;
   a valve metal sheet having a dielectric part formed throughout an entire surface of the conductive layer;
   a protection layer covering the valve metal sheet;
   a first electrode terminal electrically connected to the conductive layer and partially exposed from an external surface of the protection layer; and a second electrode terminal electrically connected to a surface of the valve metal sheet which is opposite to a surface of the valve metal sheet on which the dielectric part is provided, and the second electrode terminal partially exposed from the external surface of the protection layer;

wherein the dielectric part is made of an oxide of a metallic material of the valve metal sheet, the dielectric part is formed with a corrugated surface on the conductive layer, and the conductive particles of the conductive layer are in contact with the corrugated surface of the dielectric part.

2. The capacitor according to claim 1, wherein the corrugated surface of the dielectric part is formed as a porous layer containing pores which are filled up with the conductive particles of the conductive layer.

3. The capacitor according to claim 1, wherein the dielectric part of the valve metal sheet is formed by an anodic oxide film of a metallic material of the valve metal sheet.

4. The capacitor according to claim 1, wherein the valve metal sheet is in the form of a foil or a sheet.

5. The capacitor according to claim 1, wherein the metallic material of the valve metal sheet is made of a metallic element selected from a group of metallic elements including aluminium, tantalum, niobium, titanium, hafnium, zirconium, zinc, tungsten, bismuth, and antimony.

6. The capacitor according to claim 1, wherein the conductive particles of the conductive layer are made of a material selected from among Ag, Au, Cu, and graphite.

7. The capacitor according to claim 1, wherein the first electrode terminal is provided in a through hole of the valve metal sheet, and a gap between the first electrode terminal and an inside surface of the through hole is filled up with the protection layer.

8. The capacitor according to claim 1, wherein a plurality of the first electrode terminals and a plurality of the second electrode terminals are arranged in a lattice formation on the protection layer surface, and the first electrode terminals and the second electrode terminals are alternately arranged in each of two orthogonal directions.

9. An electronic substrate including a capacitor, a semiconductor device, and a wiring substrate provided to connect the capacitor and the semiconductor device electrically, wherein the capacitor comprises:

a substrate;

a conductive layer provided on the substrate and containing conductive particles;

a valve metal sheet having a dielectric part formed throughout an entire surface of the conductive layer;

a protection layer covering the valve metal sheet;

a first electrode terminal electrically connected to the conductive layer and partially exposed from an external surface of the protection layer; and a second electrode terminal electrically connected to a surface of the valve metal sheet which is opposite to a surface of the valve metal sheet on which the dielectric part is provided, and the second electrode terminal partially exposed from the external surface of the protection layer;

wherein the dielectric part is made of an oxide of a metallic material of the valve metal sheet, the dielectric part is formed with a corrugated surface on the conductive layer, and the conductive particles of the conductive layer are in contact with the corrugated surface of the dielectric part.

* * * * *